(12) United States Patent
Rudelic

(10) Patent No.: US 7,426,605 B2
(45) Date of Patent: Sep. 16, 2008

(54) METHOD AND APPARATUS FOR OPTIMIZING FLASH DEVICE ERASE DISTRIBUTION

(76) Inventor: John C. Rudelic, 1025 Sandwick Way, Folsom, CA (US) 95630

( * ) Notice: Subject to any disclaimer, the term of this patent is extended or adjusted under 35 U.S.C. 154(b) by 249 days.

(21) Appl. No.: 11/240,004

(22) Filed: Sep. 30, 2005

(65) Prior Publication Data

US 2007/0079054 A1    Apr. 5, 2007

(51) Int. Cl.
*G06F 12/00*    (2006.01)

(52) U.S. Cl. .................. 711/103; 711/156; 711/165; 711/173

(58) Field of Classification Search .............. 711/103
See application file for complete search history.

(56) References Cited

U.S. PATENT DOCUMENTS

| | | | | |
|---|---|---|---|---|
| 5,485,595 | A * | 1/1996 | Assar et al. ............ | 711/103 |
| 5,568,423 | A * | 10/1996 | Jou et al. ............... | 365/185.33 |
| 5,754,817 | A * | 5/1998 | Wells et al. ............ | 711/203 |
| 5,862,083 | A * | 1/1999 | Tobita et al. ........... | 365/185.09 |
| 6,000,006 | A * | 12/1999 | Bruce et al. ............ | 711/103 |
| 6,016,275 | A * | 1/2000 | Han ....................... | 365/185.29 |
| 6,880,038 | B2 * | 4/2005 | Jacobs .................... | 711/103 |
| 7,096,313 | B1 * | 8/2006 | Chang et al. ........... | 711/103 |
| 7,139,863 | B1 * | 11/2006 | Defouw et al. ......... | 711/103 |
| 2005/0015540 | A1 * | 1/2005 | Tsai et al. ............... | 711/103 |
| 2005/0071592 | A1 * | 3/2005 | DeCaro .................. | 711/163 |
| 2005/0144361 | A1 * | 6/2005 | Gonzalez et al. ....... | 711/103 |

OTHER PUBLICATIONS

Mei-Ling Chiang et al., "Using Data Clustering to Improve Cleaning Performance for Flash Memory," 1999, Software Practice and Experience p. 267-276.*

* cited by examiner

*Primary Examiner*—Brian R. Peugh
*Assistant Examiner*—Kalpit Parikh
(74) *Attorney, Agent, or Firm*—Blakely, Sokoloff, Taylor & Zafman LLP

(57) ABSTRACT

A remapping circuit is connected to a memory. A configuration register is connected to the memory. The configuration register includes performance information for memory blocks in the memory. Also, a system includes a processor, a memory management device is connected to the processor, a display is connected to the processor, a non-volatile memory including a memory blocks is connected to the memory management device, and a register is connected to the non-volatile memory. The memory management device to re-map the non-volatile memory based on information stored in the register.

19 Claims, 4 Drawing Sheets

```
arrange_flash()
{
    for (i=0; i<NUM_BLOCKS; i++)
    {
        read block erase data
        store block erase data in array
        increment array index
    }
    sort the array
    configure the flash for specific application
}
```

```
arrange_flash()
{
    for (i=0; i<NUM_BLOCKS; i++)
    {
        read block erase data
        store block erase data in array
        increment array index
    }
    sort the array
    configure the flash for specific application
}
```

FIG. 7

METHOD AND APPARATUS FOR OPTIMIZING FLASH DEVICE ERASE DISTRIBUTION

BACKGROUND

1. Field

The embodiments relate to non-volatile memory, and more particularly to increasing performance of flash memory operations.

2. Description of the Related Art

Non-volatile memory is a type of memory that can retain data and information without needing a power source applied. Typically this type of memory is referred to as "flash" memory or electrically erasable programmable read only memory (EEPROM). Flash memory is used in various types of devices, such as personal computers (PCs), notebook computers, personal digital assistants (PDAs), cellular telephones, digital cameras, etc. Most flash memories only guarantee a limited number of erase and re-write cycles.

With flash memory, data can be written in bytes and erased in blocks of memory. The blocks of memory typically vary between vendors and can range from 256 bytes to 1 Mbyte in size. Some platform architectures use a limited number of flash memory blocks as additional memory space, or "scratch" space. These blocks can be considered as cache memory for frequently used data.

BRIEF DESCRIPTION OF THE DRAWINGS

The embodiments are illustrated by way of example, and not by way of limitation, in the figures of the accompanying drawings and in which like reference numerals refer to similar elements and in which:

FIG. 7 illustrates pseudo-code for one embodiment.

DETAILED DESCRIPTION

The embodiments discussed herein generally relate to improving flash memory performance. Referring to the figures, exemplary embodiments will now be described. The exemplary embodiments are provided to illustrate the embodiments and should not be construed as limiting the scope of the embodiments.

One embodiment matches block erase time for memory blocks to assign memory blocks in a non-volatile memory, such as flash memory or electrically erasable programmable read only memory (EEPROM). As typical flash memory devices have variability on the erase time of specific flash blocks, one embodiment sets a predetermined threshold for memory block assignment.

Figure 1:
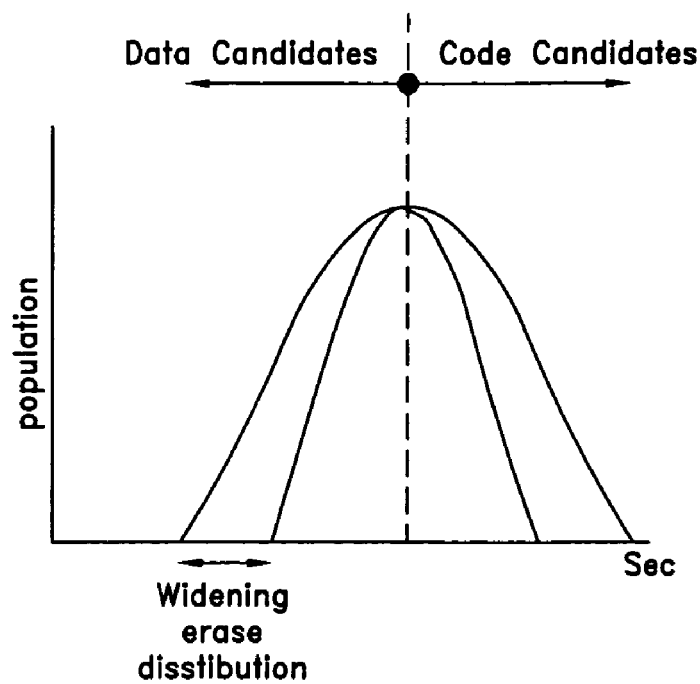
FIG. 1 illustrates a graph of memory erase time and a memory block assignment threshold. For an embodiment.

FIG. 1 illustrates a graph for an embodiment where the centered dotted line is a threshold for flash memory block assignment. Flash memory blocks that exhibit slow erase time are assigned for storing code as code is rarely updated. Flash memory blocks that exhibit fast erase time are assigned for storing data as data is updated more often than code. The left-hand side of the threshold is for assigning flash memory blocks for storing data while the right-hand side of the threshold is for assigning flash memory blocks for storing code. The width of the erase time distribution will expand over time, as illustrated in FIG. 1 by the two bell curves. That is, the erase time delta between the best performing block and the worst performing block in a flash device will become worse in future flash generations. It should be noted that erase time can also increase with the amount of erase cycles performed. In one embodiment, the increase in the erase time distribution is accommodated in a system by matching the erase time to the typical usage of a specific block by an application.

Figure 2:
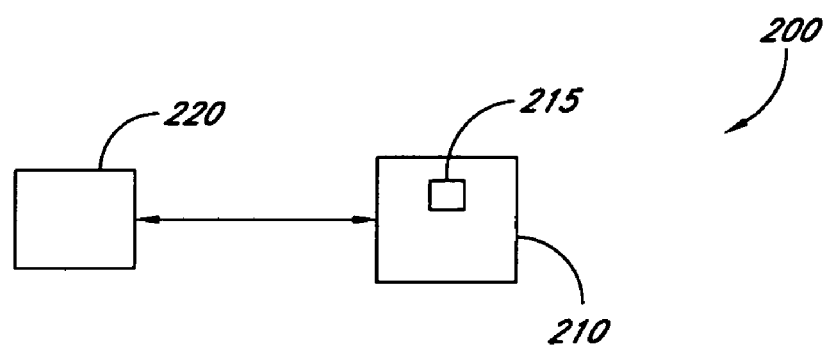
FIG. 2 illustrates an embodiment including a remapping circuit.

FIG. 2 illustrates one embodiment including remapping circuit 220 that is connected to memory 210. In one embodiment memory 210 is a non-volatile memory, such as a flash memory, EEPROM, etc. In one embodiment, memory 210 includes configuration register 215. In this embodiment configuration register 215 stores performance information for memory blocks disposed within memory 215. In one embodiment the performance information includes memory block erase information. In another embodiment the performance information is memory block application performance information, such as programming time for each memory block. In yet another embodiment, both memory block erase information and memory block programming performance information are included in the performance information.

In one embodiment remapping circuit 220 physically remaps memory blocks within memory 210. In this embodiment a portion of the memory blocks stores data information and another portion of the memory blocks stores code information. In one embodiment, memory blocks are physically remapped so that memory blocks allocated for data information are contiguous and memory blocks allocated for code information are contiguous.

In one embodiment remapping circuit 220 physically remaps the memory blocks in memory 210 based on the performance information. That is, memory blocks that perform above a threshold for memory erase/programming performance time are allocated to store code information and memory blocks that perform below a threshold are allocated to store data information. In this embodiment, the memory blocks allocated for data information are remapped contiguously, as are the memory blocks allocated for code information. In this embodiment, the performance information is predetermined for each memory block during the manufacturing of memory 210.

In the embodiment where the performance information is memory erase information, the time it takes to erase a specific memory block is recorded/stored. This information is then stored in configuration register 215. In the embodiment where the performance information is programming performance information, the time it takes to program each specific memory block is recorded/stored. This information is then stored in configuration register 215.

Figure 3:
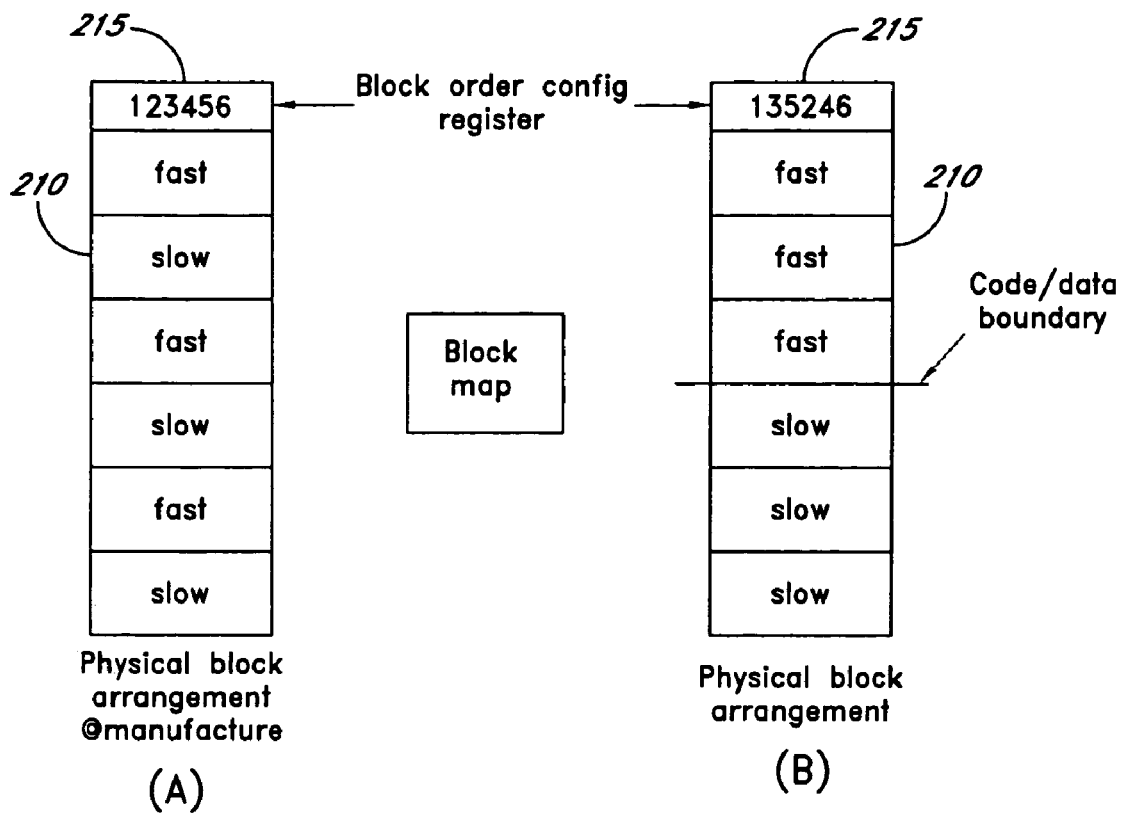
FIG. 3 illustrates a physical arrangement of memory blocks according to one embodiment.

In one embodiment, the memory blocks allocated for data information are physically relocated. FIG. 3 illustrates an example of memory 210 with configuration register 215. In FIG. 3, the reference (A) indicates the structure and physical mapping of memory 210 at time of manufacture. The memory blocks marked "fast" are memory blocks that perform below a memory block erase time threshold or programming performance time threshold. The memory blocks marked "slow" are memory blocks that perform above a memory block erase time threshold or application performance time threshold.

Reference (B) in FIG. 3 illustrates memory 210 after remapping circuit physically remaps the memory blocks based on the performance information. As illustrated, the memory blocks indicated as "fast" are contiguously mapped, as are the memory blocks indicated as "slow." The "fast" memory blocks are then used for storing data as these memory blocks will be used more often than the "slow" memory blocks, which are used to store code that is not frequently erased or programmed. In one embodiment remapping circuit 220 uses memory block swapping/memory block relocation to reorder the memory blocks physically in memory 210. In one embodiment remapping circuit 220 reads the performance information in configuration register 215 and reorders the memory blocks based on the performance times. In one embodiment the memory blocks are remapped using dynamic block swap techniques known in the art.

In one embodiment a system designer can allocate memory blocks for a specific purpose based on the performance information. Memory blocks that store data information benefit from fast erase performance while memory blocks that store code information do not need faster erase performance as they are not frequently programmed/erased. In another embodiment, memory 210 is remapped by remapping circuit 220 to have the fastest performing memory blocks located on a portion of memory 210 for a data file system. System boot commands are stored in the code allocated memory blocks as a mechanism to improve factory program time.

In one embodiment, the threshold indicated in FIG. 1 is set based on an average of the performance of all memory blocks. In another embodiment, the threshold is predetermined based on system requirements. In this embodiment, the threshold can be skewed up or down based on timing necessity. In another embodiment, memory blocks that do not perform as needed are used for other purposes, such as storing configuration information that is not accessed often.

In one embodiment, block erases are tracked for each memory block within memory 210. In one embodiment, after a predetermined number (e.g., 1000, 2000, 30000, 5000, etc.) of memory block erases, a memory block is reassigned accordingly (i.e., a block assigned to data ("fast") is changed to a code ("slow") assignment). In another embodiment, after a predetermined number of memory block erases, erase time per block is re-measured by remapping circuit 220 and stored in configuration register 215. Remapping circuit 220 then physically remaps memory 210 based on the determined threshold.

Figure 4:
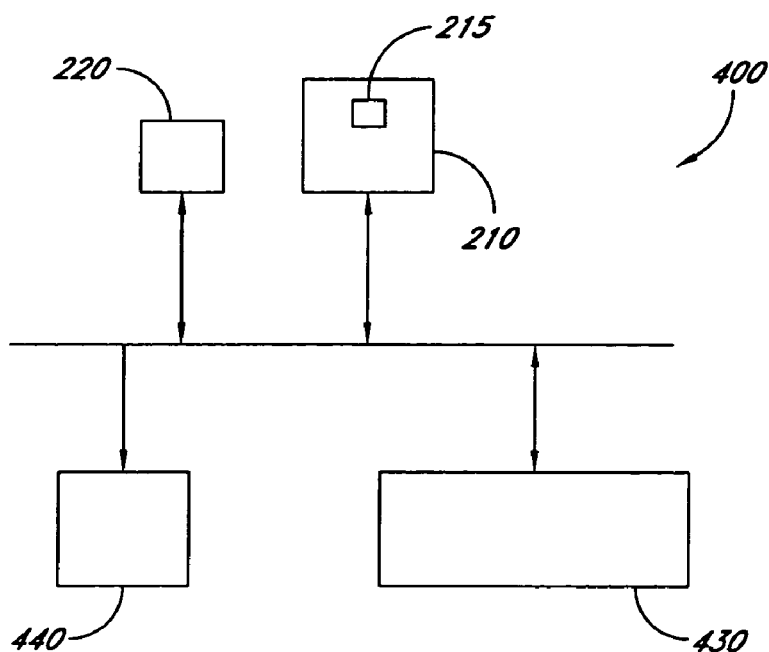
FIG. 4 illustrates a system embodiment.

FIG. 4 illustrates an embodiment of system 400 including memory 210, remapping circuit 220 to manage memory 210, processor 430 and display 440. In one embodiment the elements of system 400 communicate over at least one central communication device. In one embodiment the central communication device is a bus. In another embodiment, wireless channels are used for communication.

In one embodiment display 440 may be a display device such as an active matrix liquid crystal display (LCD), dual-scan super-twist nematic display, etc. Lower cost display panels with reduced resolutions and only monochrome display capabilities can also be included in system 400. One should note that future technology flat screen/projection/reflection displays can also be used for display 440.

In one embodiment system 400 is disposed in devices such as, cellular telephones, personal digital assistants (PDA's), notebook computers, palm computers, desk top computers, servers, digital cameras, etc. As previously described, remapping circuit 220 remaps memory blocks within memory 210 based on performance information stored in configuration register 215.

Figure 5:
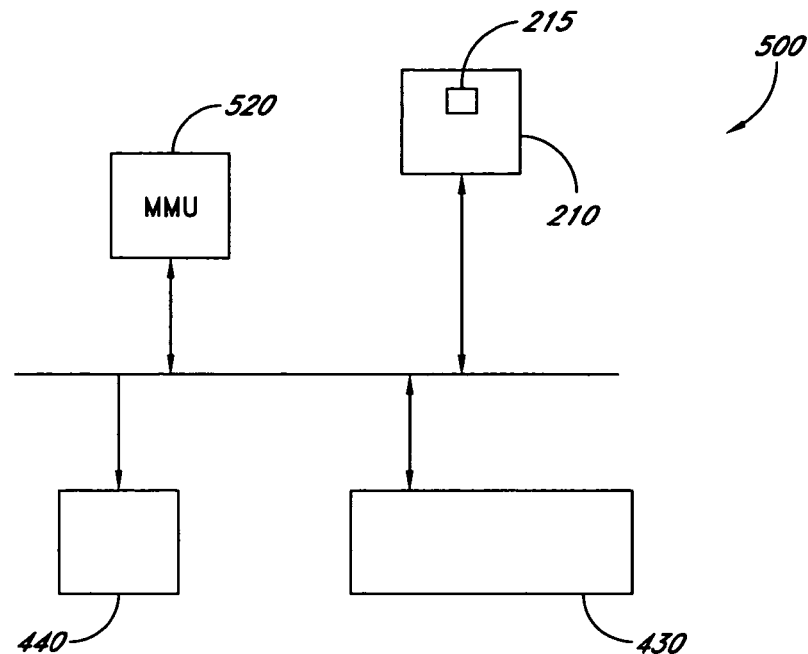
FIG. 5 illustrates another system embodiment.

FIG. 5 illustrates an embodiment of system 500 including memory 210, memory management unit (MMU) 520 to manage memory 210, processor 430 and display 440. In one embodiment MMU 520 logically remaps memory blocks in memory 210 based on performance information stored in configuration register 215. In one embodiment, MMU 520 pre-exists in a system and is reprogrammed to read configuration register 215 and remap memory blocks in memory 210 based on performance information stored in configuration register 215. In another embodiment, MMU 520 is installed in system 500 already programmed electronically designed to logically remap memory blocks in memory 210. In one embodiment the performance information includes memory block erase information. In another embodiment the performance information is memory block programming performance information. In yet another embodiment, both memory block erase information and memory block programming performance information are included in the performance information.

In one embodiment MMU 520 logically remaps memory blocks within memory 210. In this embodiment a portion of the memory blocks stores data information and another portion of the memory blocks stores code information. In one embodiment, memory blocks are logically remapped so that memory blocks allocated for data information are logically contiguous and memory blocks allocated for code information are logically contiguous.

In one embodiment MMU 520 logically remaps the memory blocks in memory 210 based on the performance information. That is, memory blocks that perform above a threshold for memory erase/programming performance time are logically allocated to store code information and memory blocks that perform below a threshold are logically allocated to store data information. In this embodiment, the memory blocks logically allocated for data information are remapped contiguously, as are the memory blocks logically allocated for code information. In this embodiment, the performance information is predetermined for each memory block during the manufacturing of memory 210.

In the embodiment where the performance information is memory erase information, the time it takes to erase a specific memory block is recorded/stored. This information is then stored in configuration register 215. In the embodiment where the performance information is programming performance information, the time it takes to program each specific memory block is recorded/stored. This information is then stored in configuration register 215.

In one embodiment, block erases are tracked for each memory block within memory 210. In one embodiment, after a predetermined number (e.g., 1000, 2000, 30000, 5000, etc.) of memory block erases, a memory block is logically reassigned accordingly (i.e., a block assigned to data ("fast") is changed to a code ("slow") assignment). In another embodiment, after a predetermined number of memory block erases, erase time per block is re-measured by MMU 520 and stored in configuration register 215. MMU 520 then logically remaps memory 210 based on the determined threshold.

Figure 6:
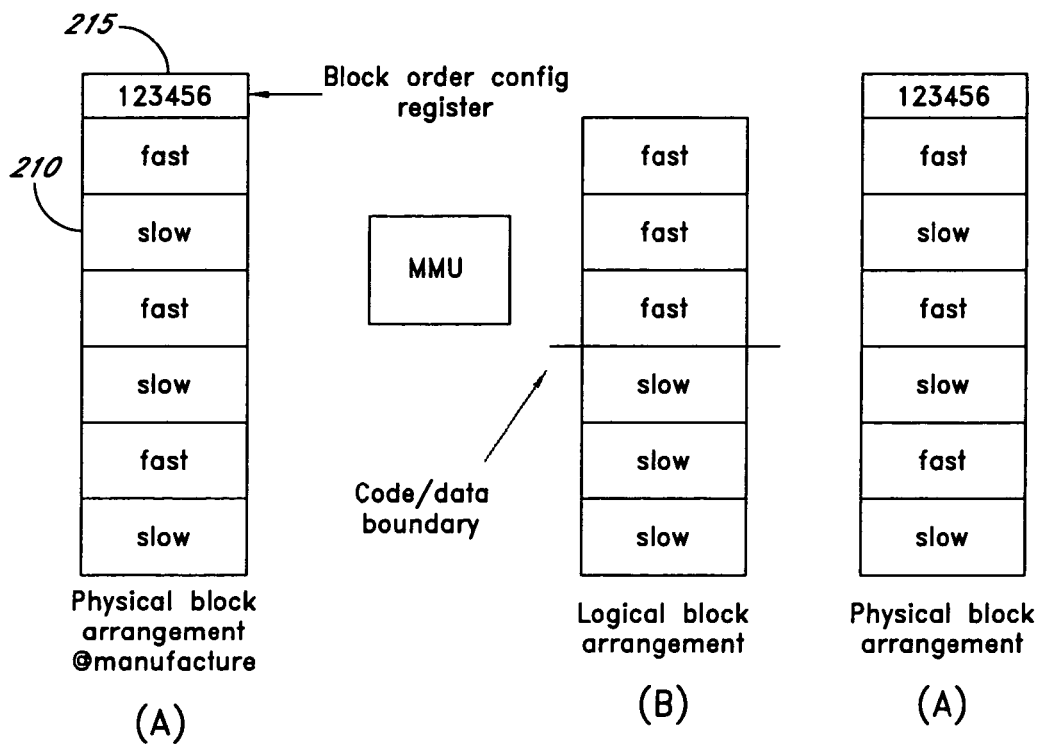
FIG. 6 illustrates a logical arrangement of memory blocks according to one embodiment

FIG. 6 illustrates an example of memory 210 with configuration register 215 where system 500 logically remaps memory blocks in memory 210 based on performance information stored in configuration register 215. In FIG. 6, the reference (A) indicates the structure and physical mapping of memory 210 at time of manufacture. The memory blocks marked "fast" are memory blocks that perform below a memory block erase time threshold or application performance time threshold. The memory blocks marked "slow" are memory blocks that perform above a memory block erase time threshold or application performance time threshold.

Reference (B) in FIG. 6 illustrates memory 210 after MMU 520 logically remaps the memory blocks based on the performance information. As illustrated, the memory blocks indicated as "fast" are contiguously logically mapped, as are the memory blocks indicated as "slow." The "fast" memory blocks are then used for storing data as these memory blocks will be used more often than the "slow" memory blocks, which are used to store code that is not frequently accessed. In one embodiment MMU 520 uses virtual memory relocation to reorder the memory blocks physically in memory 210. In one embodiment MMU 520 reads the performance information in configuration register 215 and reorders the memory blocks based on the performance times.

In one embodiment a system designer can logically allocate memory blocks for a specific purpose based on the performance information. Memory blocks that store data information benefit from fast erase performance while memory blocks that program code information do not need faster erase performance as they are not frequently accessed/erased. In another embodiment, memory 210 is logically remapped by MMU 520 to have the fastest performing memory blocks located on a portion of memory 210 where system boot commands are stored as a mechanism to improve factory program time. In one embodiment MMU 520 mappings are set to create a logical order where the memory blocks are contiguous (i.e., fast/slow) while they may physically be scattered.

FIG. 7 illustrates pseudo code for an embodiment where remapping circuit 220 or MMU 520 is programmed to manage memory 210 based on performance information stored in configuration register 215. As illustrated in FIG. 7, remapping circuit 220 or MMU 520 is programmed to read performance information from configuration register 215, store the read data incrementally in an array, sort the array based on the performance information (e.g., from fastest to slowest or vice versa), reconfigure the memory blocks in memory 210 (i.e., physically by remapping circuit 220 or logically by MMU 520).

Some embodiments can also be stored on a device or machine-readable medium and be read by a machine to perform instructions. The machine-readable medium includes any mechanism that provides (i.e., stores and/or transmits) information in a form readable by a machine (e.g., a computer, PDA, cellular telephone, etc.). For example, a machine-readable medium includes read-only memory (ROM); random-access memory (RAM); magnetic disk storage media; optical storage media; flash memory devices; and biological electrical, mechanical systems. The device or machine-readable medium may include a micro-electromechanical system (MEMS), nanotechnology devices, organic, holographic, solid-state memory device and/or a rotating magnetic or optical disk. The device or machine-readable medium may be distributed when partitions of instructions have been separated into different machines, such as across an interconnection of computers or as different virtual machines.

One embodiment include a machine-accessible medium containing instructions that, when executed, cause a machine to store performance information in configuration register 215 and remap memory 210 based on the performance information. In one embodiment the performance information is specific for each block of all blocks in memory 210. In one embodiment the memory blocks are logically remapped into at least two contiguous segments (e.g., "fast" and "slow"). In another embodiment the memory blocks are physically remapped into at least two contiguous segments. (e.g., "fast" and "slow"). In one embodiment a threshold is determined for performance and each block is assigned criteria (i.e., "fast" or "slow") based on the threshold.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances "an embodiment," "one embodiment," or "some embodiments" are not necessarily all referring to the same embodiments. If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

What is claimed is:

1. An apparatus comprising:
    a memory;
    a configuration register to store performance information for memory blocks disposed within the memory, the performance information comprising memory block erase time; and
    a remapping circuit coupled to the memory and the configuration register, the remapping circuit to
        read the performance information from the configuration register for each memory block,
        store the performance information of each memory block in a array,
        sort the array according to the performance information, and
        remap the memory blocks to store data in a first contiguous portion and to store code in a second contiguous portion based on the sorted array and a memory block erase time performance threshold.

2. The apparatus of claim 1, wherein the configuration register is disposed within the memory.

3. The apparatus of claim 1, wherein the performance information further comprises memory block application performance time information.

4. The apparatus of claim 3, wherein the remapping circuit remaps the memory blocks to store data in a first contiguous portion and to store code in a second contiguous portion based on an application performance time threshold.

5. The apparatus of claim 4, wherein the memory blocks are physically remapped.

6. The apparatus of claim 1, wherein the memory is a flash memory.

7. A system comprising:
    a processor;
    a memory management device coupled to the processor;
    a display coupled to the processor;
    a non-volatile memory including a plurality of memory blocks coupled to the memory management device; and
    a register to store performance information for the memory blocks, the performance information comprising memory block erase time, wherein the memory management device
        reads the performance information from the register for each memory block, stores the performance information of each memory block in an array, sorts the array according to the performance information, and re-maps the non-volatile memory to store data in a first contiguous portion and to store code in a second contiguous portion based on the sorted array and a memory block erase time performance threshold.

8. The system of claim 7, wherein the memory management device operates to re-map the non-volatile memory based on memory block application time performance information.

9. The system of claim 7, wherein the memory management device physically re-maps the plurality of memory blocks in at least two contiguous segments.

10. The system of claim 7, wherein the memory management device is one of a memory management unit and a remapping circuit.

11. A machine-accessible medium containing instructions that, when executed, cause a machine to:

store memory block performance information in a register, the performance information comprising memory block erase time for each block of a plurality of blocks in a memory;

read the performance information from the register for each block, store the performance information of each block in an array, sort the array according to the performance information; and remap the memory to store data in a first contiguous portion and to store code in a second contiguous portion based on the sorted array and a memory block erase time performance threshold.

12. The machine-accessible medium of claim 11, wherein the instruction causing the machine to remap causes the machine to logically remap the plurality of blocks in the memory into at least two contiguous segments.

13. The machine-accessible medium of claim 11, wherein the instruction causing the machine to remap causes the machine to physically remap the plurality of blocks in the memory into at least two contiguous segments.

14. The machine-accessible medium of claim 11, further containing instructions, that, when executed cause the machine to:

determine block erase timing performance for each block of the plurality of blocks.

15. The machine-accessible medium of claim 11, further containing instructions that, when executed, cause the machine to:

determine application timing performance for each block of the plurality of blocks.

16. The machine-accessible medium of claim 11, wherein the memory is a flash memory.

17. The machine-accessible medium of claim 16, wherein the register is disposed within the flash memory.

18. The machine-accessible medium of claim 11, further comprising instructions that, when executed, cause the machine to:

determine a timing threshold for performance;

assign criteria for each block of the plurality of blocks based on the timing threshold;

designate a first set of the plurality of blocks to store code based on the timing threshold; and designate a second set of the plurality of blocks to store data values based on the timing threshold.

19. A machine-accessible medium containing instructions that, when executed, cause a machine to perform a method comprising:

storing memory block performance information in a register, the performance information comprising memory block programming time for each block of a plurality of blocks in a memory;

reading the performance information from the register for each memory block, storing the performance information of each memory block in an array, sorting the performance information of each memory block in an array remapping the memory to store data in a first contiguous portion and to store code in a second contiguous portion based on the sorted array and a memory block programming time performance threshold.

* * * * *